(12) United States Patent
Kurita et al.

(10) Patent No.: US 6,814,274 B2
(45) Date of Patent: Nov. 9, 2004

(54) BONDING TOOL CAPABLE OF BONDING INNER LEADS OF TAB TAPES TO ELECTRODE PADS IN HIGH QUALITY AND HIGH PRODUCTIVITY AND BONDING METHOD

(75) Inventors: Yoichiro Kurita, Tokyo (JP); Teruji Inomata, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/179,907

(22) Filed: Jun. 24, 2002

(65) Prior Publication Data

US 2003/0010812 A1 Jan. 16, 2003

(30) Foreign Application Priority Data

Jun. 25, 2001 (JP) .......................................... 2001-191133

(51) Int. Cl.$^7$ .............................................. B23K 31/00
(52) U.S. Cl. .................... 228/6.2; 228/15.1; 228/180.21
(58) Field of Search .......................... 228/179.1, 180.1, 228/180.21, 180.22, 6.2, 110.1, 1.1, 180.5, 4.5, 15.1, 51, 54

(56) References Cited

U.S. PATENT DOCUMENTS 6,183,589 B1    2/2001  Kim et al.

FOREIGN PATENT DOCUMENTS

| JP | 4-119641 | 4/1992 |
| KR | 1998-073406 | 11/1998 |

*Primary Examiner*—Kiley Stoner
(74) *Attorney, Agent, or Firm*—Katten Muchin Zavis Rosenman

(57) ABSTRACT

When viewed in a first direction, a cross section of a pressing surface of the bonding tool for pressing the inner leads is flat and extends uniformly over a range longer than the interval between every two electrode pads. When viewed in a second direction orthogonal to the first direction, and when the inner leads are pressed to the electrode pads by virtue of a predetermined pressing force, the length of a pressing area having a pressing force acting between the inner leads and the electrode pads is shorter than the length of each electrode pad.

11 Claims, 3 Drawing Sheets

BONDING TOOL CAPABLE OF BONDING INNER LEADS OF TAB TAPES TO ELECTRODE PADS IN HIGH QUALITY AND HIGH PRODUCTIVITY AND BONDING METHOD

BACKGROUND OF THE INVENTION

The present invention relates to a bonding tool for use in a semiconductor device manufacturing process for electrically connecting input and output terminals of an IC chip to an outside circuitry. In particular, this invention relates to a bonding method for connecting inner leads of TAB tapes, as well as a bonding tool for use in the bonding method.

With the development of civil information apparatuses having more and more sophisticated functions, there has been a remarkable increase in the number of input and output terminals of IC (Integrated Circuit) chips used in these apparatus. Conventionally, there has been known a method called TAB (Tape Automated Bonding) for use in electrically connecting IC chips having a great number of input and output terminals to an outside circuitry. According to such TAB method, each TAB tape comprising an insulating tape and a predetermined wiring pattern formed on the insulating tape is used for connecting an IC chip to an outside circuitry.

An electric connection between a TAB tape and an IC chip can usually be effected by using a method called Inner Lead Bonding Process. According to this method, at first, a plurality of input and output terminals are arranged on an IC chip and located near edges on its mounting surface. Then, a plurality of openings called device holes for mounting an IC chip are formed in a TAB tape. Subsequently, a plurality of inner leads forming a wiring pattern are caused to protrude from the edges of these openings, in a pattern corresponding to an input and output terminal arranging pattern on the IC ship. Afterwards, the inner leads are pressed and thus bonded onto a plurality of electrode pads formed on the IC chip, using a bonding tool.

At this time, as one of the most commonly used bonding methods for bonding the inner leads onto the corresponding electrode pads, it is allowed to use a gang bonding method which is capable of simultaneously bonding the inner leads onto all of the electrode pads.

Such a gang bonding method requires that a plurality of electrode bumps (formed by a metal such as gold) be formed in advance on the input and output terminals of an IC chip 11. Then, a bonding tool is used which has a flat bottom surface having almost the same size as the IC chip. The bottom surface of the bonding tool is thus caused to press all the inner leads, so that these inner leads can be bonded onto the electrode pads provided in advance on the IC chip.

In this way, since the gang bonding method can be used to bond all the inner leads onto the input and output terminals on an IC chip during only one operation, the bonding operation is allowed to be finished in a reduced time period, thereby ensuring an extremely high productivity. However, on the other hand, since it is necessary to form (in advance) electrode bumps for later connection between the inner leads and the input and output terminals on an IC chip, it is difficult to avoid an increase in the production cost.

In order to inhibit an increased production cost caused due to the formation of electrode bumps, Japanese Unexamined Patent Publication No. 53-52365 has disclosed a bumpless TAB process in which inner leads of TAB tapes are directly bonded onto aluminum pads forming input and output terminals on an IC chip, without having to form electrode bumps. In carrying out such bumpless process, since an oxide film formed on each aluminum pad has to be removed, is preferable to use a supersonic bonding method in which a supersonic vibration is applied to a bonding tool pressing inner leads against the aluminum pads, thereby bonding the inner leads onto the aluminum pads.

However, when the bumpless TAB process is used to bond all the inner leads to the aluminum pads in only one operation, a strong pressing force will be unduly applied to some of the inner leads, causing an unfavorable effect on the IC chip. Another problem might be that it is difficult to ensure a sufficient pressing force, resulting in an insufficient bonding. In order to avoid these problems, it is required that the bonding process be performed under a condition where a pressing force is uniformly applied to all the inner leads. However, if a pressing force is to be uniformly applied to all the inner leads, it is necessary to adjust, with a high precision, a parallelity between an IC chip and a bonding tool. In view of this, a conventional bumpless TAB method employs a single point bonding manner for bonding inner leads one by one. As a result, it is difficult for a conventional bumpless TAB method to avoid a greatly lower productivity than the above-described gang bonding method.

SUMMARY OF THE INVENTION

Accordingly, it is an object of the present invention to provide an improved bonding method capable of avoiding the above-described problems and an improved bonding tool for use in the improved bonding method.

According to one aspect of the present invention, there is provided a bonding tool for bonding, by using a predetermined pressing force, a plurality of inner leads to a plurality of electrode pads. The electrode pads are those formed in advance on an IC (Integrated Circuit) chip, and the inner leads are those protruding from TAB (Tape Automated Bonding) tapes and arranged in parallel to one another at an interval corresponding to an interval between every two electrode pads. In particular, when viewed in a first direction, a cross section of a pressing surface of the bonding tool for pressing the inner leads is flat and extends uniformly over a range longer than the interval between every two electrode pads. When viewed in a second direction orthogonal to the first direction, the length of a pressing area is shorter than the length of each electrode pad. The pressing area is where a pressing force acts between the inner leads and the electrode pads when the inner leads are pressed to the electrode pads by virtue of a predetermined pressing force.

According to another aspect of the present invention, there is provided a bonding method, with using the bonding tool, of bonding a plurality of inner leads to a plurality of electrode pads by means of a predetermined pressing force. The electrode pads are those formed in advance on an IC chip, and the inner leads are those protruding from TAB tapes and arranged in parallel to one another at an interval corresponding to an interval between every two electrode pads. The method comprises the steps of positioning the IC chip and the TAB tapes in a manner such that the respective inner leads are located on the corresponding electrode pads; and using the bonding tool to make its pressing surface to get into contact with the inner leads, in a manner such that the flat portion of the pressing area uniformly extending in a range longer than an interval between every two electrode pads will become parallel to an arranging direction of the electrode pads, while the central portion of the pressing area when viewed in the second direction orthogonal to the first direction is located in the center of each electrode pad, thereby bonding the plurality of inner leads to the electrode pads in one operation.

Other configurations and advantages of the present invention will become apparent by reading the present specification.

DESCRIPTION OF THE PREFERRED EMBODIMENTS:

In order to facilitate an understanding of the present invention, the following description will be given to explain the bonding tool and bonding method based on some related arts, with reference to the accompanying drawings.

Figure 1:
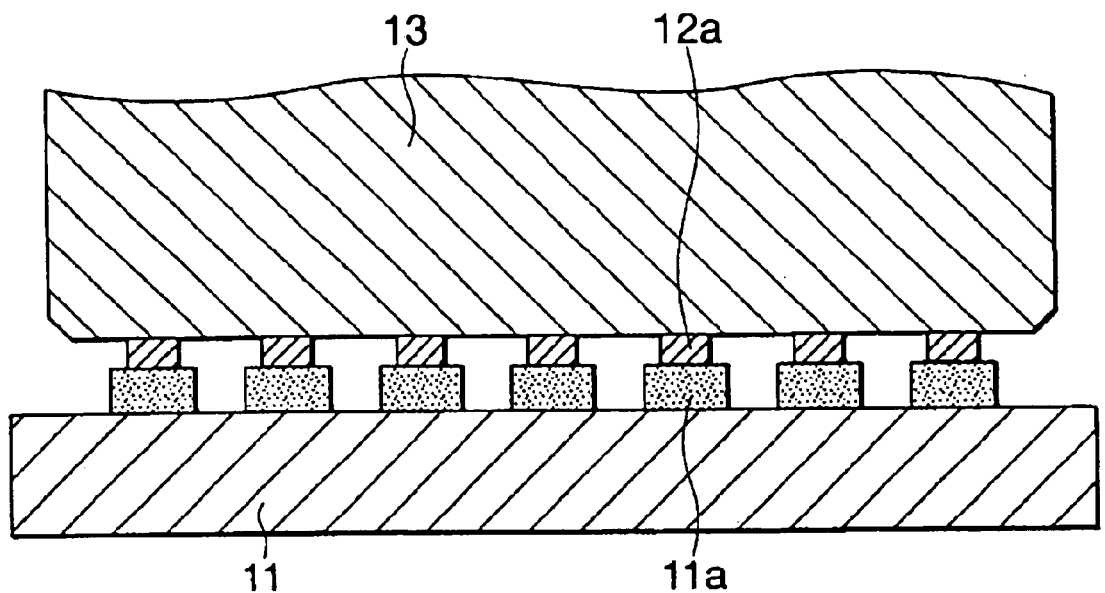
FIG. 1 is a cross sectional view formed by cutting along a direction perpendicular to a protruding direction of a plurality of inner leads, schematically showing a condition in the vicinity of a bonding area, illustrating how an IC chip and TAB tapes may be bonded together using a gang bonding method according to a related art.
Figure 2:
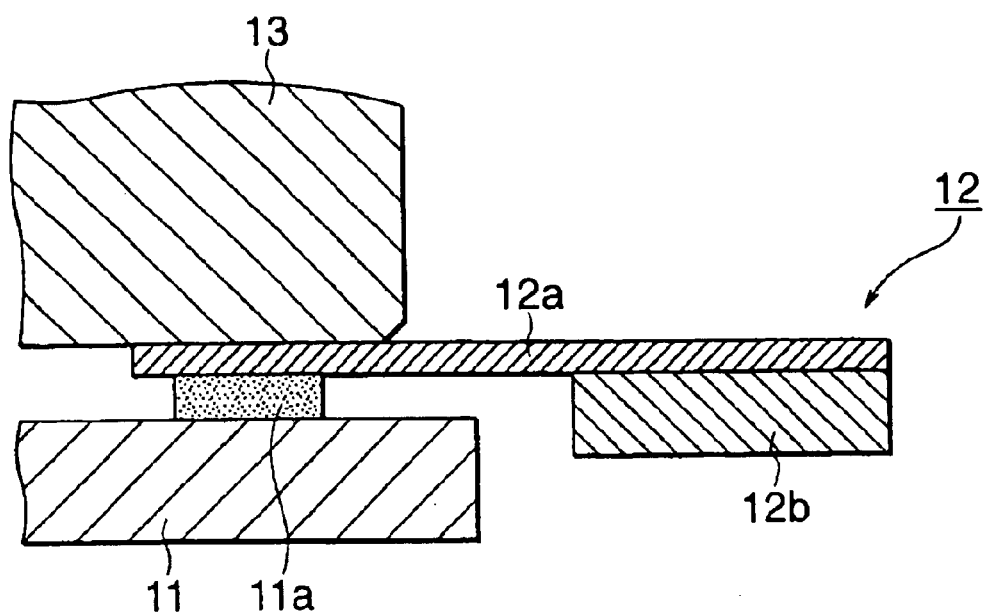
FIG. 2 is a schematic cross sectional view formed by cutting along a direction parallel to the protruding direction of the inner leads shown in FIG. 1.

Namely, when TAB tapes and an IC chip are to be electrically connected with each other during an inner lead bonding process, it is permitted to employ one of the most common methods for bonding each inner lead with each corresponding electrode pad, using a gang bonding manner in which all inner leads are simultaneously pressed on to all electric pads, as shown in FIGS. 1 and 2. In fact, FIGS. 1 and 2 are explanatory schematic views showing how an IC chip 11 and TAB tapes 12 may be bonded together using a gang bonding manner, and also illustrating a surrounding area located in the vicinity of the bonding area. In more detail, FIG. 1 is a cross sectional view formed by cutting along a direction perpendicular to a protruding direction of inner leads 12a, FIG. 2 is a cross sectional view formed by cutting along a direction parallel to the protruding direction of the inner leads 12a. Specifically, an inner lead 12a is formed on each TAB tape 12, thereby forming a predetermined wiring pattern on an electrically insulating tape 12b. Further, the inner leads 12a are formed in a manner such that they project respectively and independently in areas corresponding to device holes.

In the aforementioned gang bonding manner, a plurality of electrode bumps 11a consisting of a metal such as gold are usually formed in advance on the input and output terminals of an IC chip 11. Further, as a bonding tool 13, it is allowed to use a pressing member having a flat bottom surface of substantially the same size as the IC chip, so that it is possible for the flat bottom surface of the pressing member to simultaneously press all the inner leads 12, thereby effecting a desired pressing and a desired bonding.

Figure 3:
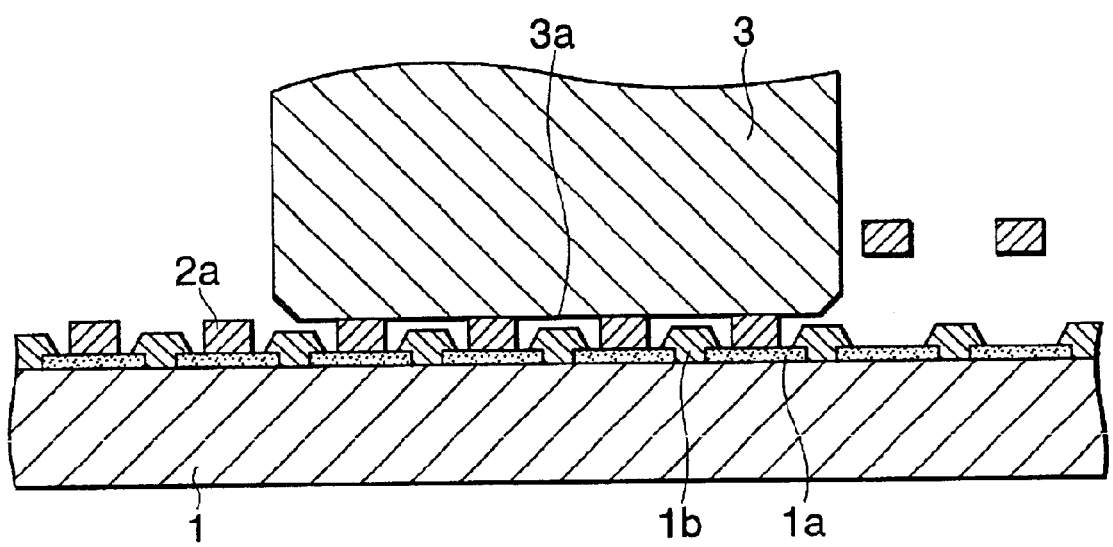
FIG. 3 is a cross sectional view formed by cutting along a direction perpendicular to a protruding direction of a plurality of inner leads, schematically showing a condition in the vicinity of a bonding area, illustrating how an IC chip and TAB tapes may be bonded together using a gang bonding method according to the present invention.
Figure 4A:
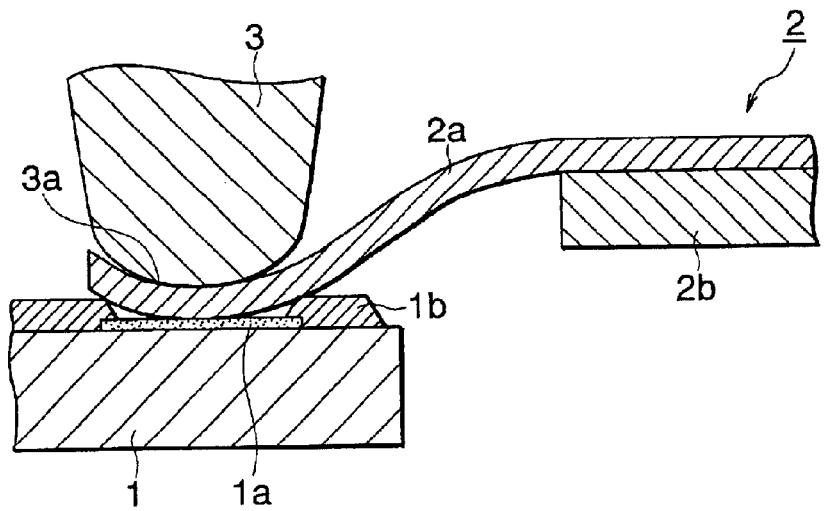
FIGS. 4A, 4B and 4C are schematic cross sectional views formed by cutting along a direction parallel to the protruding direction of the inner leads shown in FIG. 3.
Figure 4B:
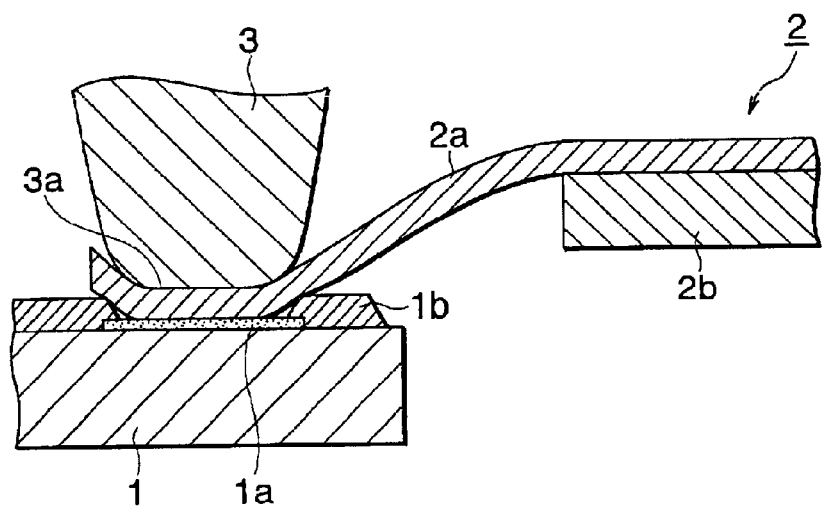
Figure 4C:
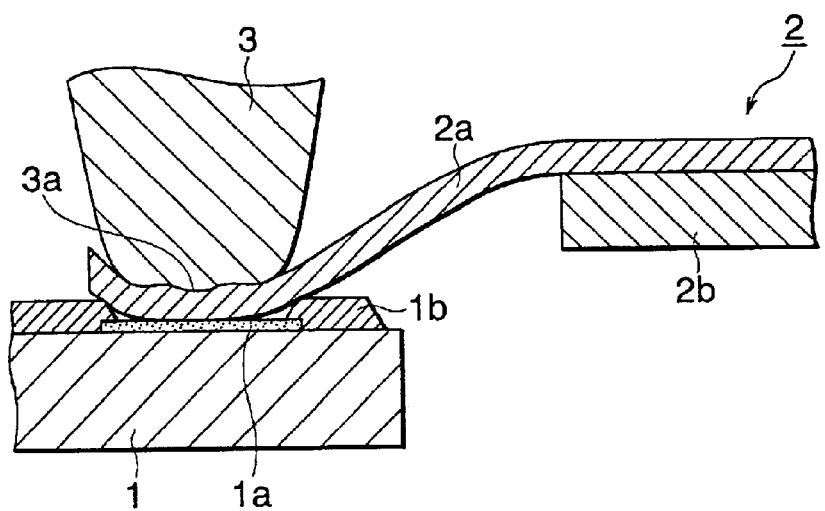

Next, an embodiment of the present invention will be described with reference to FIGS. 3 and 4. In fact, FIGS. 3 and 4 are explanatory schematic views showing how an IC chip 1 and TAB tapes 2 may be bonded together using a bonding method according to the present invention, and also illustrating a surrounding area located in the vicinity of a bonding area. In more detail, FIG. 3 is a cross sectional view formed by cutting along a direction perpendicular to the protruding direction of the inner leads 2a, FIG. 4 includes several cross sectional views each formed by cutting along a direction parallel to the protruding direction of the inner leads 2a. In further detail, FIG. 4A, FIG. 4B and FIG. 4C are used to respectively show several examples using different bonding tools 3 having different bottom surface shapes.

In the present embodiment, a plurality of aluminum electrode pads 1a serving as input and output terminals are formed and arranged at a predetermined interval on the IC chip 1 (to be bonded with TAB tapes 2), in positions close to one end on one surface of the IC chip. Further, on one surface of the IC chip 1 on which the electrode pads 1a have been formed, there is provided a cover film 1b having a plurality of openings formed for exposing the respective electrode pads 1a. Specifically, the outer surface of each electrode pad 1a is more inwardly located than that of the cover film 1b.

Moreover, a plurality of inner leads 2a each forming a predetermined wiring pattern on each corresponding electrically insulating tape 2b, are provided on a plurality of TAB tapes 2. In fact, the plurality of inner leads 2a are arranged in parallel to one another at an interval corresponding to the electrode pads 1a, protruding independently in a predetermined direction in device hole areas. In particular, each inner lead 2a is plated with gold.

Further, in the present embodiment, a bonding tool 3 for bonding the inner leads 2a to the electrode pads 1a has a bottom surface 3a which is formed in a manner such that its length in a first direction (right and left direction in FIG. 3) is longer than the interval formed between every two electrode pads 1a, and that its length in a second direction (perpendicular to the paper face in FIG. 3) orthogonal to the first direction has the same length as that of each electrode pad 1a (when viewed in a protruding direction of each inner lead 2a to be bonded).

The cross section of the bottom surface 3a, which is arranged in a direction having a length longer than the interval between every two electrode pads 1a, is formed into a flat configuration, as schematically shown in FIG. 3. On the other hand, as shown in FIG. 4, the cross section of the bottom surface 3a, which is arranged in a direction having the same length as the length of each electrode pad 1a, is formed into a smoothly curved (slightly protruding in the downward direction in FIG. 4) portion in the vicinity of the center thereof. In fact, the bottom surface 3a can either be formed such that the entire bottom surface presents a smooth curve (as shown in FIG. 4A), or formed such that the bottom surface has a flat portion in the vicinity of the center thereof and its corner portions are smoothly curved (as shown in FIG. 4B). In addition, it is also possible that the bottom surface 3a can have a slightly rugged portion, as shown in FIG. 4C.

Next, description will be given to explain an operation for carrying out a bonding process for bonding the inner leads onto the IC chip.

At first, the IC chip 1 and the TAB tapes 2 are positioned in a manner such that the inner lead 2a of each TAB tape 2 is located above each corresponding electrode pad 1a on the IC ship 1. Then, the bottom surface of a bonding tool 3 is caused to press the upper surface of each inner lead 2a, so as to press each inner lead 2a to each corresponding electrode pad 1a. At this time, the bonding tool 3 is caused to press in a manner such that the bottom surface 3a of the bonding tool 3 showing a longitudinal length longer than an interval formed between every two electrode pads 1a, will be parallel to the arranging direction of the electrode pads 1a. Meanwhile, the bottom surface 3a of the bonding tool 3 showing a lateral length equal to the length of each electrode pad 1a, will have its central portion (when viewed in its lateral length direction) positioned in the center of each electrode pad 1a. In this way, the plurality of inner leads 2a can be simultaneously pressed onto the plurality of electrode pads 1a by means of the bonding tool 3.

At this time, since the bottom surface 3a of the bonding tool 3 has a flat cross section in a direction perpendicular to the protruding direction of the inner leads 2a, there is almost no possibility that during the pressing, the position of each inner lead 2a in the direction perpendicular to its protruding direction will deviate from a corresponding electrode pad 1a. In practice, an important point to which an attention should be paid when designing and making the bonding tool is only to ensure that the flat portion of the bonding tool can cover almost an entire area which will come into contact with a plurality of inner leads 2a (even if the bonding tool performs pressing only once). For instance, if the bonding tool 3 is required to provide a high working precision, it is allowed to remove corner portions of the bottom surface 3a of the bonding tool.

Further, since the bottom surface 3a of the bonding tool 3 has a centrally protruding cross section in a direction parallel to the protruding direction of each inner lead 2a, it is possible to properly press each inner lead 2a against each corresponding electrode pad 1a exposed in each corresponding opening of the cover film 1b, without causing any damage to the cover film 1b. Moreover, as shown in FIG. 4B, it is also preferable to provide a flat area in the vicinity of the center of the protruding portion of the bottom surface 3a in accordance with the size of each electrode pad 1a, thereby ensuring a sufficiently increased pressing area.

Then, with the inner leads 2a being pressed against the electrode pads 1a by virtue of the bonding tool 3, a supersonic vibration is added to the bonding tool 3, thereby ensuring that the plurality of inner leads 2a (in a pressed state) can be simultaneously bonded to the corresponding electrode pads 1a. At this time, as shown in FIG. 4C, since the bottom surface 3a of the bonding tool has a slightly rugged portion on its cross section in a direction parallel to the protruding direction of each inner lead 1a, it is possible to ensure an increased friction coefficient between the bonding tool 3 and the inner leads 2a, thereby making it possible to effectively supply a supersonic energy to an interface between the inner leads 2a and the electrode pads 1a.

Subsequently, the bonding tool 3 and the IC chip 1 are adjusted in their positions, in a manner such that the bottom surface 3a of the bonding tool is positioned on the inner leads 2a which have not been bonded to the IC chip, but are located adjacent to an area where the desired bonding have been finished. Then, in the same manner as described in the above, the plurality of inner leads 2a located under the bonding tool 3 are pressed and thus bonded onto the electrode pads 1a. In this way, by repeating the process of bonding a plurality of inner leads 2a to a plurality of electrode pads 1a, it is exactly possible to bond the inner leads 2a to all the electrode pads 1a on the IC chip 1.

At this time, if the electrode pads 1a have been provided in the vicinity of opposite edges on the bonding surface of the IC chip 1, the bonding tool 3 and the IC chip 1 are adjusted in their positions, in a manner such that the bottom surface 3a of the bonding tool 3 is positioned on these electrode pads 1a. Further, if the electrode pads 1a have been provided also in the vicinity of adjacent edges on the bonding surface of the IC chip 1, the bonding tool 3 is rotated as needed in a plane parallel to the bonding surface of the IC chip 1, so that the bottom surface 3a in its longitudinal direction which is longer than an interval between every two electrode pads 1a will become parallel to the arranging direction of the electrode pads 1a.

With the use of the bonding method of the present embodiment as described above, since a plurality of inner leads 2a can be connected to a plurality of electrode pads 1a in only one operation, it is possible to ensure a much higher productivity than a conventional method in which a plurality of inner leads are connected to a plurality of electrode pads by being pressed and connected one by one. In fact, at this time, an area for effecting the above pressing by virtue of the bonding tool 3 is allowed to be smaller than that required in a conventional method in which all the inner leads 2a are about to be connected also in one operation. As a result, if all the inner leads 2a are about to be connected in one operation, it is not necessary to perform a high precision adjustment for a positional relationship such as a parallelity between the bonding surface of the IC chip 1 and the bottom surface 3a of the bonding tool 3, but ensuring that each inner lead 2a can be pressed easily and properly onto each corresponding electrode pad 1a by virtue of a predetermined pressing force. For this reason, the bonding can be performed properly using a bumpless method which ensures that each inner lead 2a can be directly bonded to each corresponding electrode pad 1a, without having to form in advance a plurality of electrode bumps on each IC chip 1. Therefore, as compared with a conventional bonding method involving the formation of electrode bumps, it is possible to greatly reduce the production cost.

Although the present embodiment has shown that a process for bonding the inner leads 2a to the electrode pads 1a can be achieved by using a supersonic bonding method capable of bonding together the two sorts of elements by adding a supersonic vibration to the bonding tool 3, it is also possible to use a thermal pressing method in which the bonding tool 3 is continuously heated and pressed, thereby effecting the desired bonding. In addition, it is also possible to use an eutectic bonding method to effect the desired bonding.

While this invention has thus far been described in conjunction with a few preferred embodiments thereof, it will now be readily possible for those skilled in the art to put this invention into practice in various other manners.

What is claimed is:

1. A bonding tool for bonding, by using a predetermined pressing force, a plurality of inner leads to a plurality of electrode pads, said electrode pads being those formed in advance on an IC (Integrated Circuit) chip, said inner leads being those protruding from TAB (Tape Automated Bonding) tapes and arranged in parallel to one another at an interval corresponding to an interval between every two electrode pads:

when viewed in a first direction, which is perpendicular to a protruding direction of said inner leads, a cross section of a pressing end surface of the bonding tool for pressing the inner leads is flat and extends uniformly over a range longer than the interval between every two electrode pads;

when viewed in a second direction, which is parallel to said protruding direction of said inner leads, a cross section of the pressing end surface is not flat, the length of a pressing area is shorter than the length of each electrode pad, said pressing area being where a pressing force acts between the inner leads and the electrode pads when the inner leads are pressed to the electrode pads by virtue of a predetermined pressing force.

2. The bonding tool according to claim 1, wherein when viewed in the second direction, the pressing end surface presents a cross section which is smoothly curved with its central portion protruding.

3. The bonding tool according to claim 2, wherein when viewed in the second direction, the pressing end surface presents a cross section which has a flat area in the center thereof.

4. The bonding tool according to claim 1, wherein when viewed in the second direction, the pressing end surface presents a cross section which has a slightly rugged area.

5. A bonding method, with using a the bonding tool according to any one of claims 1 to 4, of bonding a plurality of inner leads to a plurality of electrode pads by using a predetermined pressing force, said electrode pads being those formed in advance on an IC chip, said inner leads being those protruding from TAB tapes and arranged in parallel to one another at an interval corresponding to an interval between every two electrode pads, the method comprising the steps of:

positioning the IC chip and the TAB tapes in a manner such that the respective inner leads are located on the corresponding electrode pads; and using said bonding tool to make its pressing surface to get into contact with the inner leads, in a manner such that the flat portion of the pressing area uniformly extending in a range longer than an interval between every two electrode pads will become parallel to an arranging direction of the electrode pads, while the central portion of the pressing area when viewed in the second direction orthogonal to the first direction is located in the center of each electrode pad, thereby bonding the plurality of inner leads to the electrode pads in one operation.

6. The bonding method according to claim 5, wherein the step of bonding the plurality of inner leads to the electrode pads in one operation is repeated for several times, thereby bonding each inner lead to each corresponding electrode pad formed on one IC chip.

7. The bonding method according to claim 6, further comprising a step of rotating the bonding tool in a plane parallel to a bonding surface of the IC chip.

8. The banding method according to claim 5, wherein the IC chip is covered with a cover film having openings for exposing the electrode pads, said cover film being formed on the same surface on which the electrode pads are formed, the outer surface of each electrode pad being located more inwardly than the outer surface of each cover film.

9. The bonding method according to claim 5, wherein the inner leads are bonded to the electrode pads by means of a supersonic bonding method.

10. The bonding method according to claim 5, wherein the inner leads are bonded to the electrode pads by means of a heat pressing method.

11. The bonding method according to claim 5, wherein the inner leads are bonded to the electrode pads by means of an eutectic bonding method.

* * * * *